(12) United States Patent
Logsdon

(10) Patent No.: US 7,784,423 B1
(45) Date of Patent: Aug. 31, 2010

(54) SYSTEM AND METHOD FOR DISPENSING MATERIAL ONTO A SEMICONDUCTOR WAFER

(75) Inventor: George Logsdon, Arlington, TX (US)

(73) Assignee: National Semiconductor Corporation, Santa Clara, CA (US)

( * ) Notice: Subject to any disclaimer, the term of this patent is extended or adjusted under 35 U.S.C. 154(b) by 1021 days.

(21) Appl. No.: 10/833,778

(22) Filed: Apr. 28, 2004

(51) Int. Cl.
*B05C 5/00* (2006.01)
*B05C 11/02* (2006.01)
*B65D 35/22* (2006.01)

(52) U.S. Cl. ............... 118/300; 119/319; 119/320; 119/52; 119/612; 222/92; 222/94; 222/136

(58) Field of Classification Search ............ 118/52, 118/612, 300, 319, 320; 222/136, 92, 94, 222/101, 107; 134/153, 198, 902; 396/604, 396/611, 627
See application file for complete search history.

(56) References Cited

U.S. PATENT DOCUMENTS

| | | | | |
|---|---|---|---|---|
| 3,189,227 A * | 6/1965 | Hobbs et al. | | 222/94 |
| 4,220,259 A * | 9/1980 | Lagneaux | | 222/82 |
| 4,258,862 A * | 3/1981 | Thorsheim | | 222/56 |
| 4,854,482 A * | 8/1989 | Bergner | | 222/94 |
| 4,984,704 A * | 1/1991 | O'Malley | | 220/23.4 |
| 5,184,757 A * | 2/1993 | Giannuzzi | | 222/82 |
| 6,845,883 B2 * | 1/2005 | Pieri | | 222/94 |
| 2005/0211724 A1* | 9/2005 | Arghyris et al. | | 222/94 |

* cited by examiner

*Primary Examiner*—Yewebdar T Tadesse

(57) ABSTRACT

A delivery system for dispensing material onto a semiconductor wafer is provided that includes an opening device and a dispensing device. The opening device is operable to open a packet of material. The dispensing device is operable to dispense the material from the packet onto the semiconductor wafer.

9 Claims, 3 Drawing Sheets

SYSTEM AND METHOD FOR DISPENSING MATERIAL ONTO A SEMICONDUCTOR WAFER

TECHNICAL FIELD OF THE INVENTION

The present invention relates generally to semiconductor fabrication and, more particularly, to a system and method for dispensing material onto a semiconductor wafer.

BACKGROUND OF THE INVENTION

The fabrication of semiconductor devices is an important part of manufacturing many consumer products, such as cell phones, personal computers and numerous other products. In fabricating the semiconductor wafers, metals, chemicals and other materials are applied to the wafers in many layers in order to generate a variety of different devices on the wafers. One of the more expensive materials applied to the wafers is photoresist, which allows lithography to be used to etch other types of layers on the wafers.

Conventional methods for applying material to the semiconductor wafers have many disadvantages associated with them, especially for materials such as photoresist that can react with air. Crystallization of the material caused by such reactions is a major source of debris when the material is applied to the wafers.

As technology improves, the minimum size of the line widths that may be etched in the semiconductor wafers continues to decrease. As the line widths decrease, the size of debris that is acceptable also decreases. Eventually, the line widths may become so small that the debris may become a limiting factor. Thus, line widths that actually may be implemented will be determined by the debris size, regardless of whether or not it would be physically possible to etch smaller line widths if the debris were eliminated. Thus, minimizing or eliminating the debris is becoming more and more important in the fabrication of semiconductor wafers.

For the application of many materials onto the wafers, a pump is stroked to force an adjustable volume through a dispense nozzle by way of approximately ten feet of specialty Teflon-type tubing. After each dispense of the material, a suck-back force may be applied to draw the material away from the nozzle edge. This technique is typically used for materials such as photoresist that are prone to crystallization due to contact with the atmosphere. However, although this suck-back force may reduce crystallization, it fails to eliminate crystallization as a source of debris. In addition, conventional application methods include many other sources of debris that are unaffected by the use of a suck-back force.

Disadvantages associated with conventional application methods also include the fact that many materials, such as photoresist, are supplied in bulk containers. As a result, any contamination renders the whole batch unusable. Another disadvantage is that pumps typically incorporate a flexible bellows that comes in contact with the material itself, which results in another source of contamination as the material is flexed during each dispense and suck-back cycle. Also, the pump must be maintained, repaired and adjusted to provide the correct dispense volume for each wafer. Problems with incorrect volume can lead to scrap, rework and/or excess cost and disposal fees associated with the effluent material that is spun off the wafer during the thickness control (spin) function.

Disadvantages also include the use of the Teflon-type tubing line that transports the pump output up to the nozzle. Fixing a dispense contamination event sometimes involves replacing a contaminated line. In addition, the nozzle itself may become damaged in such a way as to shed metal debris onto the wafer or may become contaminated with crystallized material. Conventional application methods dispense some of the material onto dummy wafers in an attempt to avoid introducing any crystallized material when a dispense has not been performed within a relatively short amount of time, such as approximately 30 minutes. However, there is no algorithm for determining how many dummy wafers should be used to guarantee that the debris is flushed out. This method also results in the waste of the material that is used on the dummy wafers. In addition, the dummy wafers must then be cleaned off or discarded, further increasing production costs.

Another disadvantage associated with conventional methods for applying material to wafers is that the material in the bulk containers may be depleted without an operator being able to determine that the material is gone. In this situation, the application process may continue without any material being dispensed. This results in semiconductor wafers being moved along in the production line without the appropriate material being applied.

Before undertaking the DETAILED DESCRIPTION OF THE INVENTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future, uses of such defined words and phrases.

BRIEF DESCRIPTION OF THE DRAWINGS

For a more complete understanding of the present invention and its advantages, reference is now made to the following description taken in conjunction with the accompanying drawings, wherein like reference numerals represent like parts, in which.

DETAILED DESCRIPTION OF THE INVENTION

FIGS. 1 through 4, discussed below, and the various embodiments used to describe the principles of the present invention in this patent document are by way of illustration only and should not be construed in any way to limit the scope of the invention. Those skilled in the art will understand that the principles of the present invention may be implemented in any suitably arranged semiconductor fabrication system.

Figure 1:
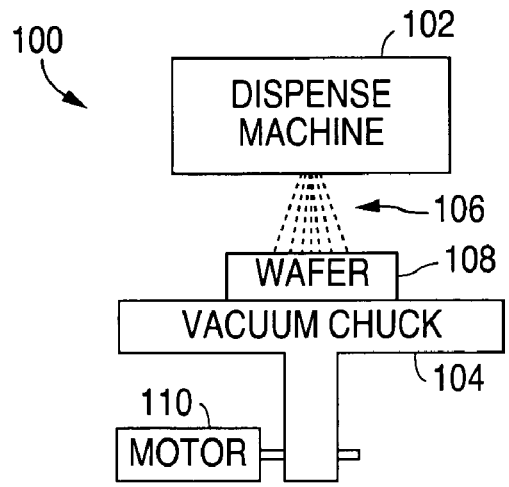
FIG. 1 is a block diagram illustrating a system for dispensing material onto a semiconductor wafer in accordance with one embodiment of the present invention.

FIG. 1 is a block diagram illustrating a system 100 for dispensing material onto a semiconductor wafer in accordance with one embodiment of the present invention. The system 100 comprises a dispense machine 102 and a vacuum chuck 104. The dispense machine 102 is operable to dispense material 106 onto a semiconductor wafer 108. The vacuum chuck 104 is operable to hold the wafer 108 in the appropriate position while the material 106 is dispensed onto the wafer 108 by the dispense machine 102. The vacuum chuck 104 comprises a motor 110 that is operable to spin the vacuum chuck 104, and therefore the wafer 108, in order to provide a desired, relatively even thickness level of the material 106 on the wafer 108 after the material 106 is applied to the wafer 108. According to one embodiment, the material 106 comprises photoresist, hexamethyldisilazane or other suitable material that may be applied to a wafer 108.

As described in more detail below, the dispense machine 102 is operable to dispense the material 106 from packets. As used herein, a "packet" means any suitable container that is operable to hold a specific amount of material 106 such that the amount of material 106 that the dispense machine 102 dispenses from the packet is sufficient for covering a limited number of wafers 108 with the desired thickness of the material 106. According to one embodiment, the limited number of wafers 108 comprises one wafer 108. Thus, for this embodiment, a packet is designed to be used for no more than a single wafer 108. According to alternate embodiments, the limited number of wafers 108 may comprise less than five wafers 108, less than ten wafers 108, or any other suitable limited number of wafers 108 such that a relatively small amount of material 106 is contained within each packet. As used herein, "each" means every one of at least a subset of the identified items.

The packets may comprise capsules, sections of a continuous tube or any other suitable form of individualized containers. In addition, the packets are formed from a substance that is inert with respect to the material 106 held inside the packet. For example, the packets may be formed from Tygon, TFE, PTFE, PFA, FEP, Texfour, DAFLEX, DAFLON or other suitable substance that is inert with respect to photoresist, hexamethyldisilazane or other material 106 that is contained inside the packets.

Figure 2:
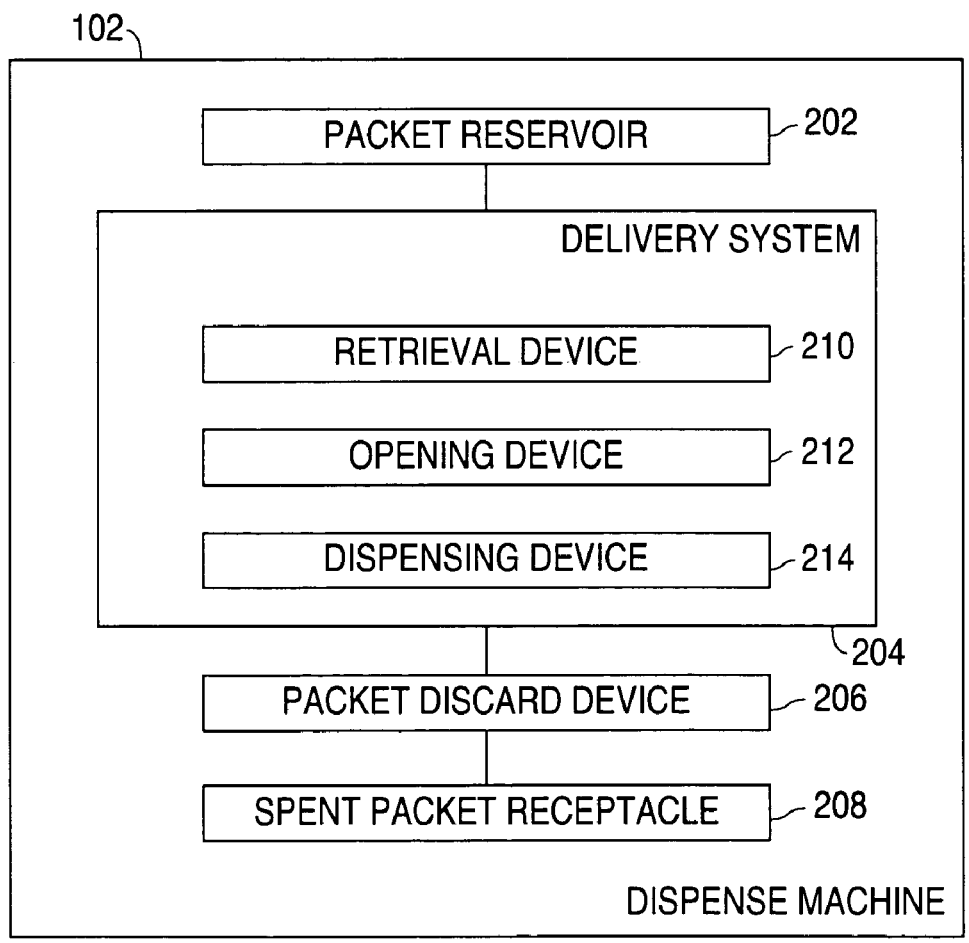
FIG. 2 is a block diagram illustrating the dispense machine of FIG. 1 in greater detail in accordance with one embodiment of the present invention.

FIG. 2 is a block diagram illustrating the dispense machine 102 in greater detail in accordance with one embodiment of the present invention. The dispense machine 102 comprises a packet reservoir 202, a delivery system 204 and an optional packet discard device 206. The dispense machine 102 may also comprise a spent packet receptacle 208.

The packet reservoir 202 is operable to store a plurality of packets of material 106. Thus, the packet reservoir 202 may comprise a storage device that may store a plurality of capsule-type packets. Alternatively, the packet reservoir 202 may comprise a continuous tube of packets. However, it will be understood that the packet reservoir 202 may comprise any other suitable type of storage device without departing from the scope of the present invention.

The delivery system 204 is coupled to the packet reservoir 202 and comprises an optional retrieval device 210, an opening device 212, and a dispensing device 214. The retrieval device 210 is operable to retrieve a packet from the packet reservoir 202 in order to dispense the material 106 from the packet onto a wafer 108. For example, the retrieval device 210 may comprise a tong-like device that is operable to physically retrieve a packet from the packet reservoir 202 and to provide the packet to the opening and dispensing devices 212 and 214 of the delivery system 204. For embodiments in which the packet reservoir 202 is operable to provide the packets directly to the delivery system 204, such as when the packet reservoir 202 comprises a tube as described below in connection with FIG. 3A, the retrieval device 210 may be omitted.

The opening device 212 may comprise a piercing tool or any other suitable device that is operable to provide an opening in each packet such that the material 106 in the packet may be dispensed from the packet onto the wafer 108. The opening device 212 may be positioned and movable in such a way as to be able to open a packet and then be moved out of the way after the packet has been opened. For example, the opening device 212 may be slid in and out, pivoted in and out, or moved in any other suitable manner.

The dispensing device 214 may comprise a clamping system that is operable to clamp the packet in order to dispense the material 106, a roller system that is operable to roll the packet in order to dispense the material 106, or any other suitable device that is operable to apply a force to the packet in order to dispense the material 106 from the packet onto the wafer 108 after the packet has been opened by the opening device 212.

For embodiments in which each packet comprises an amount of material 106 sufficient to cover more than one wafer 108, the dispensing device 214 is operable to interrupt the flow of the material 106 from the packet after the appropriate amount of material 106 has been dispensed from the packet onto a wafer 108 and to resume dispensing the material 106 onto a next wafer 108 for each of the limited number of wafers 108 until substantially all the material 106 is dispensed from the packet.

The packet discard device 206 is coupled to the delivery system 204 and comprises a device that is operable to remove spent packets, i.e., packets from which the material 106 has been dispensed, such that the delivery system 204 may open and dispense other packets without the spent packets interfering. Thus, for example, the packet discard device 206 may comprise a tong-like device that is operable to physically remove spent packets from the delivery system 204. However, it will be understood that the packet discard device 206 may comprise a suction device that is operable to remove the spent packets with suction, a gravity-based device that is operable to remove the spent packets using gravity along with a guiding mechanism that guides the packets to an appropriate location, or any other suitable device that is operable to remove spent packets. For embodiments in which the packet reservoir 202 comprises a continuous tube of packets and other similar embodiments, the packet discard device 206 may be omitted.

The spent packet receptacle 208 is coupled to the packet discard device 206 or, for the embodiment in which the packet discard device 206 is omitted, to the delivery system 204. The spent packet receptacle 208 comprises a storage device that is operable store the spent packets after the spent packets have been discarded. For example, for the embodiment in which the packets comprise capsules, the spent packet receptacle 208 may comprise a container in which the packet discard device 206 may deposit the spent packets. Although illustrated in the dispense machine 102, it will be understood that the spent packet receptacle 208 may be implemented elsewhere within the system 100 without departing from the scope of the present invention.

Figure 3A:
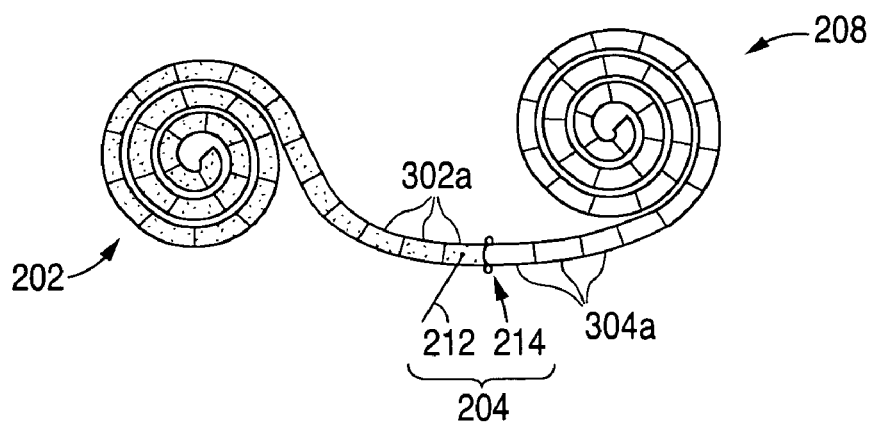
FIGS. 3A-C are illustrations of portions of the dispense machine of FIG. 2 in greater detail in accordance with several embodiments of the present invention.
Figure 3B:
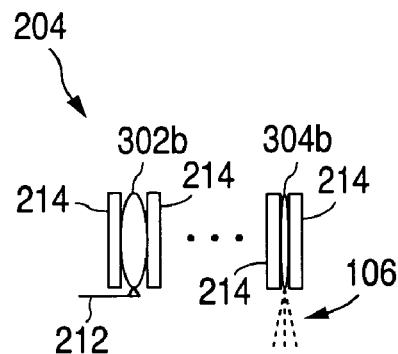
Figure 3C:
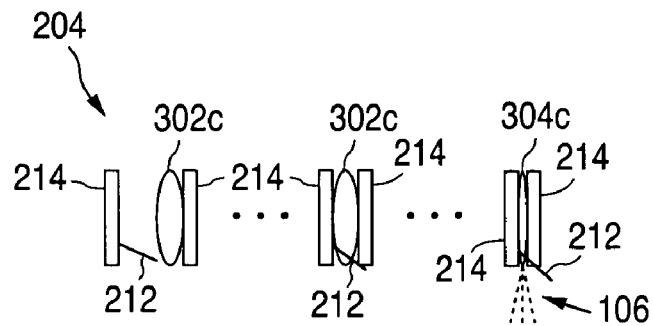

FIGS. 3A-C are illustrations of portions of the dispense machine 102 in greater detail in accordance with several embodiments of the present invention. Thus, it will be understood that the embodiments illustrated and described with respect to FIGS. 3A-C are simply examples of certain portions of the dispense machine 102 and that the portions illustrated may be implemented in any suitable manner without departing from the scope of the present invention.

FIG. 3A illustrates one embodiment of the packet reservoir 202, the delivery system 204 and the spent packet receptacle 208. For this embodiment, the packet reservoir 202 comprises a continuous tube of packets 302a, and the spent packet receptacle 208 comprises a continuous tube of spent packets 304a. The opening device 212 of the delivery system 204 comprises a piercing tool, and the dispensing device 214 of the delivery system 204 comprises a roller system.

When a wafer 108 is available for the material 106 to be dispensed onto that wafer 108, the opening device 212 pierces the packet 302a. The rollers of the dispensing device 214 then roll across the packet 302a, thereby dispensing the material 106 from the packet 302a onto the wafer 108. For one embodiment, the spent packet receptacle 208 and/or the packet reservoir 202 may move the tube of packets 302a and 304a in such a way as to pull the most recently opened packet 302a through the rollers in order to dispense the material 106.

For embodiments in which each packet comprises an amount of material 106 sufficient to cover more than one wafer 108, the rollers may be pressed together after each dispense in order to interrupt the flow of the material 106 from the packet after the appropriate amount of material 106 has been dispensed from the packet onto a wafer 108.

FIG. 3B illustrates one embodiment of the delivery system 204. For this embodiment, the packets 302b comprise capsules. The opening device 212 of the delivery system 204 comprises a piercing tool, and the dispensing device 214 of the delivery system 204 comprises a clamping system.

When a wafer 108 is available for the material 106 to be dispensed onto that wafer 108, the opening device 212 pierces the packet 302b. The dispensing device 214 then clamps together from both sides of the packet 302b and applies pressure to the packet 302b, thereby dispensing the material 106 from the packet 302b onto the wafer 108 and converting the packet 302b into a spent packet 304b, as illustrated.

In accordance with an alternate embodiment, the dispensing device 214 may comprise one mobile part and one stationary part. For this embodiment, the dispensing device 214 may press one side of the packet 302b against the stationary part of the clamping system by moving the mobile part toward the stationary part.

FIG. 3C illustrates one embodiment of the delivery system 204. For this embodiment, the packets 302c comprise capsules. The opening device 212 of the delivery system 204 comprises a piercing tool, and the dispensing device 214 of the delivery system 204 comprises a clamping system. The opening device 212 is coupled to the dispensing device 214.

When a wafer 108 is available for the material 106 to be dispensed onto that wafer 108, the dispensing device 214 begins to clamp together from both sides of the packet 302c. As the dispensing device 214 moves closer to the packet 302c, the opening device 212 pierces the packet 302c. The dispensing device 214 continues to clamp together and applies pressure to the packet 302c, thereby dispensing the material 106 from the packet 302c onto the wafer 108 and converting the packet 302c into a spent packet 304c, as illustrated.

In accordance with an alternate embodiment, the dispensing device 214 may comprise one mobile part and one stationary part, with the opening device 212 coupled to the mobile part. For this embodiment, the dispensing device 214 may press one side of the packet 302c against the stationary part of the clamping system by moving the mobile part toward the stationary part.

Figure 4:
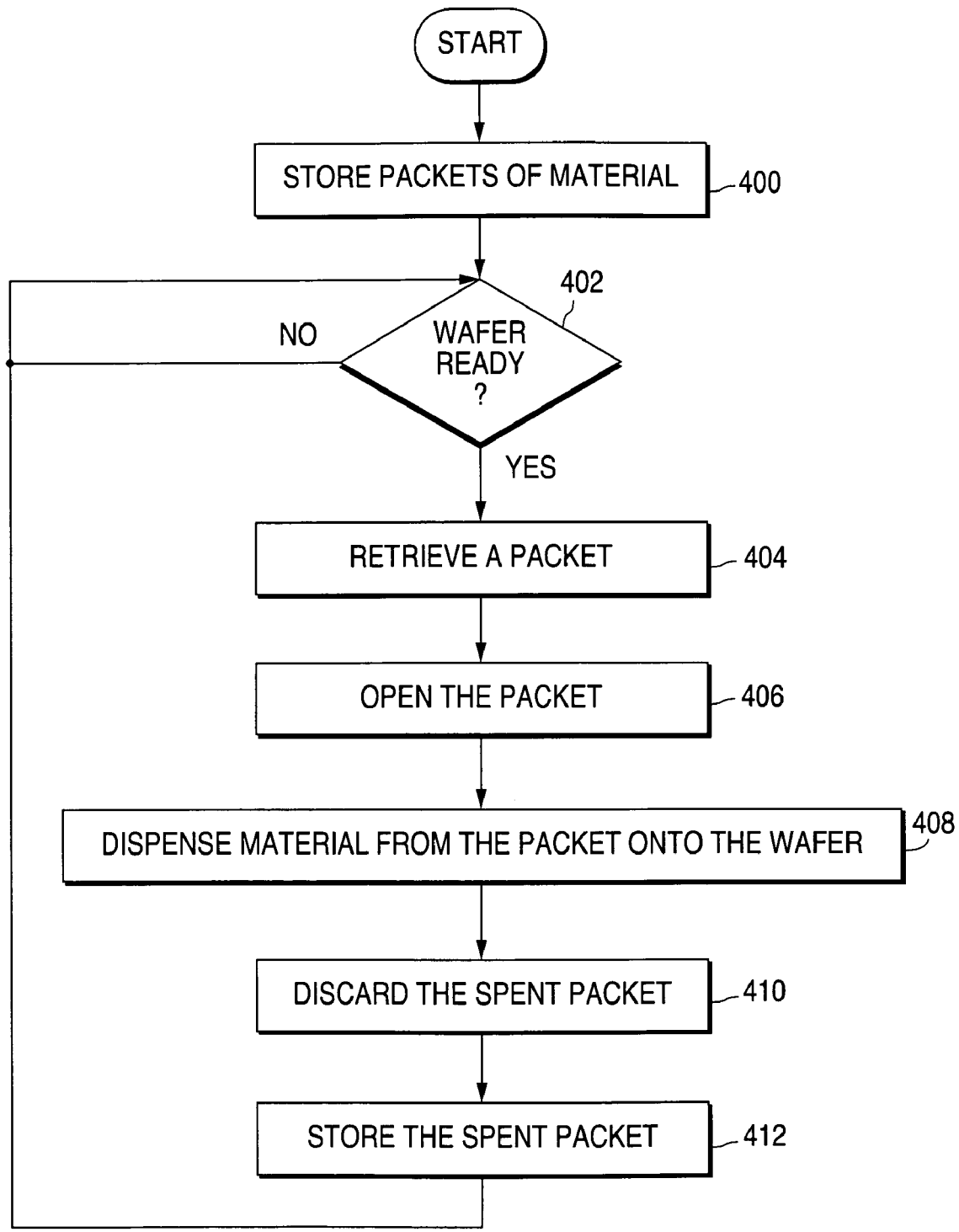
FIG. 4 is a flow diagram illustrating a method for dispensing material onto a semiconductor wafer in accordance with one embodiment of the present invention.

FIG. 4 is a flow diagram illustrating a method for dispensing material 106 onto a semiconductor wafer 108 in accordance with one embodiment of the present invention. The method begins at step 400 where packets 302 of material 106 are stored in the packet reservoir 202.

At decisional step 402, a determination is made regarding whether or not a wafer 108 is ready for material 106 to be dispensed onto it. Thus, for example, a determination is made as to whether a wafer 108 onto which material 106 is to be dispensed is in the proper position on the vacuum chuck 104. If no wafer 108 is ready for material 106 to be dispensed onto it, the method follows the No branch and remains at decisional step 402.

When a wafer 108 is ready for material to be dispensed onto it, the method may follow the Yes branch from decisional step 402 to optional step 404. If step 404 is omitted, the method follows the Yes branch from decisional step 402 to step 406. At optional step 404, the retrieval device 210 of the delivery system 204 retrieves a packet 302 from the packet reservoir 202.

At step 406, the opening device 212 of the delivery system 204 opens the packet 302. For example, according to one embodiment, the opening device 212 pierces the packet 302. It will be understood that the packet 302 may have been opened previously for embodiments in which each packet 302 comprises an amount of material 106 sufficient to cover more than one wafer 108.

At step 408, the dispensing device 214 of the delivery system 204 dispenses material 106 from the packet 302 onto the wafer 108 by applying a force to the packet 302. For example, according to one embodiment, the dispensing device 214 rolls the packet 302 to dispense the material 106. According to another embodiment, the dispensing device 214 clamps the packet 302 to dispense the material 106.

At optional step 410, the packet discard device 206 discards the spent packet 304. For example, according to one embodiment, the packet discard device 206 physically removes the spent packet 304 by way of a tong-like device. According to another embodiment, the packet discard device 206 uses suction to remove the spent packet 304. According to yet another embodiment, the packet discard device 206 uses gravity along with a guiding mechanism to guide the spent packet 304 to an appropriate location, such as the spent packet receptacle 208. At step 412, the spent packet 304 is stored in the spent packet receptacle 208, at which point the method returns to decisional step 402 where a determination is made regarding whether or not another wafer 108 is ready for material 106 to be dispensed onto it.

In this way, a precise amount of uncontaminated material 106 may be consistently dispensed onto each semiconductor wafer 108, thereby decreasing the loss of potentially expensive material 106 and greatly reducing the opportunity for debris to be introduced onto the semiconductor wafer 108. Because bottles, bags, seals, fittings, pumps, bellows, lines and nozzles are not used in the process, these sources of debris are eliminated. In addition, because the packet reservoir 202 may be made visible to an operator, the operator may easily determine when the packets 302 are running low and need to be replenished, thereby avoiding performing the dispense process without any material 106 available for dispensing.

Furthermore, the amount and/or type of material 106 dispensed may be easily changed by simply refilling the packet reservoir 202 with packets 302 that comprise a different volume and/or type of material 106.

Although the present invention has been described with several embodiments, various changes and modifications may be suggested to one skilled in the art. It is intended that the present invention encompass such changes and modifications as fall within the scope of the appended claims.

What is claimed is:

1. A delivery system for dispensing photoresist material from a packet of photoresist material onto a semiconductor wafer, comprising:
   an opening device operable to open a packet of photoresist material; and
   a dispensing device operable to dispense the photoresist material from the packet of photoresist material onto the semiconductor wafer without depositing debris on the semiconductor wafer;
   the packet of photoresist material comprising a capsule of photoresist material, the opening device comprising a piercing tool and the dispensing device comprising a clamping system.

2. A delivery system for dispensing photoresist material from a packet of photoresist material onto a semiconductor wafer, comprising:
   an opening device operable to open a packet of photoresist material; and
   a dispensing device operable to dispense the photoresist material from the packet of photoresist material onto the semiconductor wafer without depositing debris on the semiconductor wafer;
   the packet of photoresist material comprising one of a plurality of packets of photoresist material forming a tube.

3. The delivery system of claim 2, the opening device comprising a piercing tool and the dispensing device comprising a roller system.

4. A dispense machine operable to dispense photoresist material onto a semiconductor wafer, comprising:
   a packet reservoir operable to store a plurality of packets of photoresist material;
   a delivery system coupled to the packet reservoir, the delivery system operable to open one end of a packet of photoresist material and to dispense the photoresist material from the packet of photoresist material onto the semiconductor wafer without depositing debris on the semiconductor wafer; and
   a packet discard device coupled to the delivery system, the packet discard device operable to discard the packet of photoresist material after the photoresist material is dispensed from the packet.

5. The dispense machine of claim 4, further comprising a spent packet receptacle coupled to the packet discard device, the spent packet receptacle operable to store the packet after the packet is discarded.

6. A dispense machine operable to dispense photoresist material onto a semiconductor wafer, comprising:
   a packet reservoir operable to store a plurality of packets of photoresist material; and
   a delivery system coupled to the packet reservoir, the delivery system operable to open one end of a packet of photoresist material and to dispense the photoresist material from the packet of photoresist material onto the semiconductor wafer without depositing debris on the semiconductor wafer;
   the packet of photoresist material comprising one of (i) a capsule of photoresist material and (ii) one of a plurality of packets of photoresist material forming a tube; and
   the delivery system comprising:
      an opening device comprising a piercing tool; and
      a dispensing device comprising a clamping system when the packet of photoresist material comprises a capsule of photoresist material, and the dispensing device comprising a roller system when the packet of photoresist material comprises one of a plurality of packets of photoresist material forming a tube.

7. A dispense machine operable to dispense hexamethyldisilazane (HMDS) material onto a semiconductor wafer that does not deposit crystallized portions of the HMDS material onto the semiconductor wafer, comprising:
   a packet reservoir apparatus operable to store a plurality of packets of HMDS material;
   a delivery system machine coupled to the packet reservoir apparatus, the delivery system machine operable to open one end of a packet of HMDS material and to dispense the HMDS material from the packet of HMDS material onto the semiconductor wafer without depositing crystallized portions of the HMDS material onto the semiconductor wafer; and
   a packet discard device coupled to the delivery system machine, the packet discard device operable to discard the packet of HMDS material after the HMDS material is dispensed from the packet.

8. A dispense machine operable to dispense hexamethyldisilazane (HMDS) material onto a semiconductor wafer that does not deposit crystallized portions of the HMDS material onto the semiconductor wafer, comprising:
   a packet reservoir apparatus operable to store a plurality of packets of HMDS material;
   a delivery system machine coupled to the packet reservoir apparatus, the delivery system machine operable to open one end of a packet of HMDS material and to dispense the HMDS material from the packet of HMDS material onto the semiconductor wafer without depositing crystallized portions of the HMDS material onto the semiconductor wafer;
   an opening device comprising a piercing tool, and
   a dispensing device comprising a clamping system when the packet of HMDS material comprises a capsule of HMDS material, and the dispensing device comprising a roller system when the packet of HMDS material comprises one of a plurality of packets of HMDS material forming a tube.

9. The dispense machine of claim 8, the packet of HMDS material operable to hold an amount of HMDS material sufficient for covering no more than a single semiconductor wafer.

* * * * *